United States Patent [19]

Horninger

[11] 4,039,859
[45] Aug. 2, 1977

[54] PHASE COMPARATOR AND PROCESS FOR THE OPERATION THEREOF

[75] Inventor: Karlheinrich Horninger, Eglharting, Germany

[73] Assignee: Siemens Aktiengesellschaft, Berlin & Munich, Germany

[21] Appl. No.: 654,644

[22] Filed: Feb. 2, 1976

[30] Foreign Application Priority Data

Feb. 10, 1975  Germany .............................. 2505479

[51] Int. Cl.² ........................................... H03K 5/20
[52] U.S. Cl. .................................... 307/232; 307/355; 328/159; 307/361; 307/205; 328/109; 328/133
[58] Field of Search ................. 307/232, 233, 235 N, 307/235 P, 235 F; 328/109, 133, 159

[56] References Cited

U.S. PATENT DOCUMENTS

| | | |
|---|---|---|
| 3,021,481 | 2/1962 | Kalmus ............................ 328/133 X |
| 3,458,721 | 7/1969 | Maynard ......................... 307/235 P |
| 3,478,227 | 11/1969 | Ito ....................................... 307/232 |
| 3,743,946 | 7/1973 | Gass et al. ...................... 328/109 X |
| 3,761,740 | 9/1973 | Naive ................................ 307/232 |

OTHER PUBLICATIONS

IBM Tech Disclosure Bul. vol. 9, No. 12, May 1967, "Self-Decoding Comparator Circuit", by Woodman, p. 1797.

*Primary Examiner*—John S. Heyman
*Attorney, Agent, or Firm*—Hill, Gross, Simpson, Van Santen, Steadman, Chiara & Simpson

[57] ABSTRACT

A phase comparator has at least two signal comparison inputs and at least one resistance line and one or more voltage amplitude comparators. A first comparator input of each voltage amplitude comparator is connected to the resistance line. One end of the resistance line is connected by way of a first dc voltage blocking means to the first signal comparison input and the second signal comparison input is connected by way of an inverter and a second dc voltage blocking means to the other end of the resistance line. In one mode of operation the one end of the resistance line is connected to a fixed voltage and the other end is connected to an impressed current source, and the second comparator inputs of all the voltage amplitude comparators are connected to a fixed reference voltage which is equal to the arithmetic mean of the two voltages present at the ends of the resistance line and produced by the current source and the voltage source. In this mode of operation each signal comparison input is fed with one of two input signals which are to be compared and the output signal of the phase comparator is provided in parallel from all of the comparator outputs. In another mode of operation, one end of the resistance line is connected to a fixed voltage and the other end is connected to an impressed current source. The second comparator input of all the voltage amplitude comparators are connected to a fixed reference voltage which is equal to the arithmetic mean of the two voltages present at the ends of the resistance line and produced by the fixed voltage and the impressed current source. The two ends of a second resistance line are connected to a fixed voltage and a further resistor has one end connected to a tap of the second resistance line and another end connected to a fixed voltage. In this mode of operation each signal comparison input is fed, in each case, with one of the two input signals which are to be compared and the output signal of the phase comparator is obtained at the tap of the second resistance line.

12 Claims, 6 Drawing Figures

PHASE COMPARATOR AND PROCESS FOR THE OPERATION THEREOF

BACKGROUND OF THE INVENTION

1. Field of the Invention

The present invention relates to a phase comparator having at least two signal comparison inputs.

2. Description of the Prior Art

Phase comparators are known in the art and are described, for example, by M. Elphick in his article entitled "Focus on Comparator ICs" in "Electronic Design" 22, Oct. 26, 1972, pp. 52–58, and by L. Altman in his article entitled "Bridging the Analog and Digital Words with Linear ICs", published in the "Electronics", June 5, 1972, pp. 83–98. These are integrated phase comparators which are constructed as differential amplifiers. The output signal of the comparator is available as an analog signal. In order to be able to provide the different phase angle of two input signals in digital form, the phase comparator must be followed by an analog/digital converter.

SUMMARY OF THE INVENTION

The object of the present invention is to provide a phase comparator which is capable of optionally supplying a digital output signal or an analog output signal without a large additional circuit outlay.

This object is realized in a circuit in which at least one resistance line or chain and one or more voltage value comparators are provided, and in which a first comparator input of each voltage amplitude comparator is, in each case, connected to the resistance line. One end of the resistance line is connected by way of a first dc voltage blocking means to the first signal comparison input and the second signal comparison input is connected by way of an inverter and a second dc voltage blocking means to the other end of the resistance line. As used herein "dc voltage blocking means is to be understood to refer to any device which eliminates the dc voltage component of an ac voltage, and thus allows through only the ac voltage. Accordingly, suitable dc voltage blocking means are all frequency filters which at least suppress the dc voltage. Filters of this type can be produced, for example, from comparators, resistors and/or transformers. However, it is advantageous if each dc voltage blocking means consists of a capacitor. The capacitance of each of these capacitors will depend, in a known manner, upon the frequency which is to be transmitted, i.e. upon the frequency of the input signal.

Advantageously, a phase comparator, as described above, is designed in such a manner that each voltage amplitude comparator possesses at least one transistor, that the control electrode terminal of the transistor forms the first comparator input, a further transistor terminal forms the second comparator input, and the third transistor terminal forms the output of the voltage amplitude comparator. In the event that the output signal of the phase comparator is to be emitted in digital form, it is expedient for the third transistor terminal of each transistor to be connected to a load element which can be connected at its free end to a reference voltage source. Preferably, the load element consists of at least one resistor.

Advantageously, in the event that the output signal is to be emitted in analog form, a phase comparator, as described above, is designed in such a manner that the outputs of the voltage amplitude comparators are connected to a second resistance line or chain and that at least one tapping point of the second resistance line is connected with at least one resistor.

It is expedient and highly advantageous if, in each of the above described phase comparators, the signal comparison inputs can be connected in a freely selective manner by way of a switch. Preferably, the switch is an electronic switch.

In the event that the output signal is to be emitted in digital form, the relevant phase comparators, described above, are advantageously operated in such a manner that one end of the resistance line is connected to fixed voltage, and the other end is connected to an impressed current source and that the second comparator inputs of all of the voltage amplitude comparators are connected to a fixed reference which is equal to the arithmetic mean of the two voltages present at the ends of the resistance line and produced by the current source and the voltage source. Each signal comparison input in fed, in each case, with one of the two input signals which are to be compared, and the output signal of the phase comparator is obtained in parallel form from all of the comparator outputs.

If the output signal is to be emitted in an analog form, a suitable phase comparator, such as described above, is advantageously operated in such a manner that one end of the resistance line is connected to a fixed voltage, while the other end is connected with an impressed current source. The second comparator inputs of all of the voltage amplitude comparators are connected to a fixed reference voltage, where the reference voltage is equal to the arithmetic mean of the two voltages present at the ends of the resistance line and produced by the voltage source and the current source. A second resistance line is provided and the two ends of the second resistance line are connected to a fixed voltage. An additional resistor has one end connected to a tap of the second resistance line and its other end connected to another fixed voltage. Each signal comparison input is, in each case, fed fixed voltage. Each signal comparison input is, in each case, fed with one of the two input signals which are to be compared and the output signal of the phase comparator is obtained at the tap of the second resistance line. Advantageously, the reference voltage is connected to the ends of the second resistance line.

The advantages of the above described phase comparator reside in the fact that it supplies, optionally, either a digital signal or an analog signal without a high circuit outlay. Consequently, no expensive analog/digital converters are required. In addition, it can easily be integrated on a semiconductor body, for example in the MOS technique.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
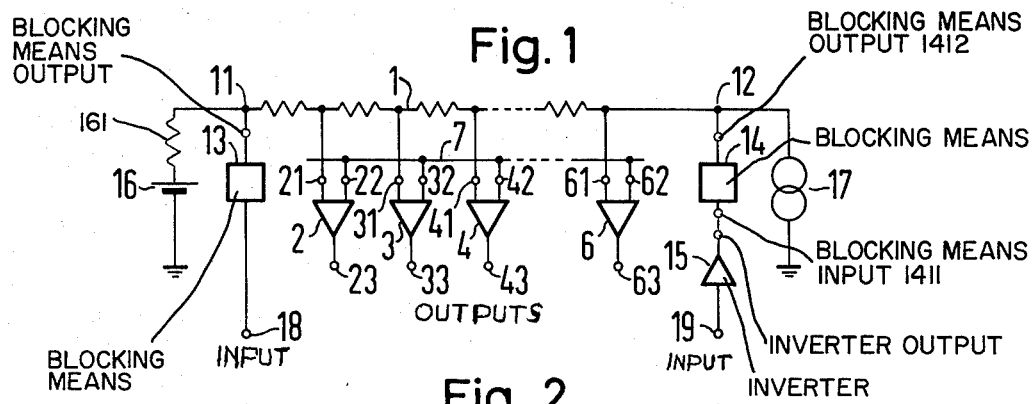
FIG. 1 is a schematic circuit diagram of a phase comparator in which the output signal is provided as a digital word.

Referring first to FIG. 1, a circuit arrangement is illustrated for a phase comparator which comprises a plurality of voltage value comparators 2, 3, 4 and 6, each of which has a respective first comparator input 21, 31, 41, 61 connected to a resistance line 1 and respective second comparator inputs 22, 32, 42, 62 connected to each other by way of an electrical conductor 7. The resistance line 1 is illustrated as comprising a plurality of resistors extending between an end point 11 and an end point 12. A signal comparison input 18 is connected, by way of a dc voltage blocking means 13 having an output 1312 connected to the end 11 of the resistance line 1, whereas another signal comparison input 19 is connected by way of the output 151 of an inverter 15 and a dc voltage blocking means 14 which has an input 1411 connected to the output 151 and an output 1412 connected to the other end 12 of the resistance line 1.

In the operation of the phase comparator represented in FIG. 1, a fixed voltage source 16 is connected to the end 11 of the resistance line 1, by way of a resistor 161, and a current is impressed at the end 12 of the resistance line 1 by a current source 17. A fixed reference voltage is connected to the electrical conductor 7. In each case, one of the two input signals which are to be compared is connected to the signal comparison input 18, whereas the other of these signals is fed to the signal comparison input 19. In addition, during operation the voltage value comparators are connected to the supply.

Figure 2:
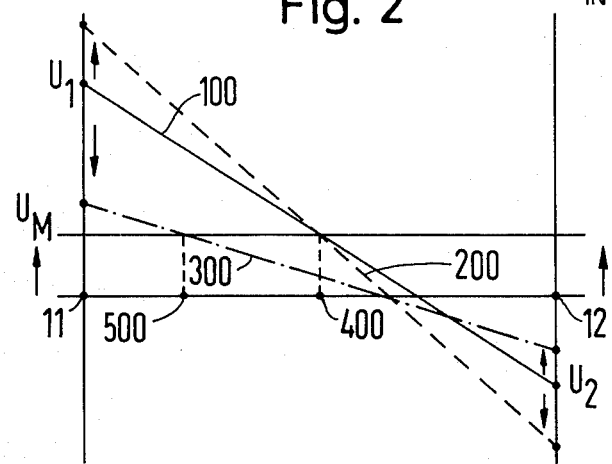
FIG. 2 is a graphic illustration of the relevant voltage drop along the resistance line for various input signals in the operation of the circuit illustrated in FIG. 1.

The mode of operation of the phase comparator illustrated in FIG. 1 will be described with reference to FIGS. 2 and 3. In FIG. 2, the straight lines 100, 200 and 300 indicate the voltage drop along the resistance line 1 from the one end 11 of the other end 12 for various input signals which are to be compared. The straight line 100 will be assumed to indicate the voltage drop when the input signals are both zero. The voltage at the end 11 of the resistance line is referenced $U_1$ and the voltage at the end 12 is referenced $U_2$. If signals are connected to the inputs 18 and 19, the same are superimposed upon the voltages $U_1$ and $U_2$. If the two signals are in phase, because of the inverter 15 they are displaced in phase by 180° at the ends of the resistance line. This means that a voltage change by a specific amount in one direction at the end 11 of the resistance line gives rise to a voltage change by the same amount in the opposite direction at the end 12 of the resistance line. The straight line 200, indicates the instantaneous voltage drop along the resistance line for such a situation. Consequently, there is no change in the point 400 of the resistance line at which the mean voltage $U_M$ prevails, where $U_m = (U_1 + U_2)/2$. If, however, the input signals are in phase, then the voltage variation at the ends of the resistance line are not equal, or not oppositely directed. The straight line 300, shown as a dot-dash line, indicates the instantaneous voltage drop for such a case. Accordingly, the location of the mean voltage $U_M$ has become displaced to the point 500. If, as a reference voltage, the voltage $U_M$ is now connected to the electrical conductor 7, all of the voltage amplitude comparators connected to the resistance line to the left of the point 400, or point 500, emit the signal "$<( > )U_M$", and all of the voltage amplitude comparators which are connected to the right of the point 400, or 500, emit the signal "$>( < )U_M$". The number of voltage amplitude comparators which emit the signal "$>( < )U_M$" is linearly dependent upon the phase shift.

Figure 3:
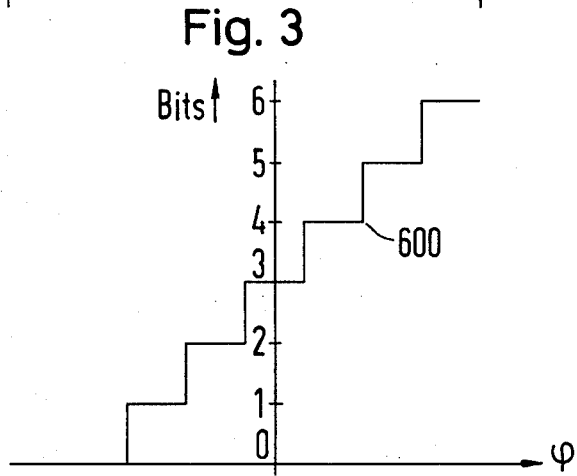
FIG. 3 is a graphic illustration showing the output characteristic of the circuit arrangement illustrated in FIG. 1, in dependence upon the phase angle.

FIG. 3 schematically illustrates the output characteristic of the phase comparator in dependence upon the phase angle. The phase angle is plotted on the abscissa, whereas the number of voltage amplitude comparators, and thus also the number of bits, is plotted on the ordinate. Under the condition that the voltage drop takes place from left to right along the resistance line, and that the signal "$>U_M$" is assigned a positive voltage value, the staircase function 600 rising toward the right is obtained.

It is also possible to use voltage value comparators which only emit a signal at the output in the event of the coincidence of the two input voltages. The point at which this signal appears is a gauge for the phase shift.

Figure 4:
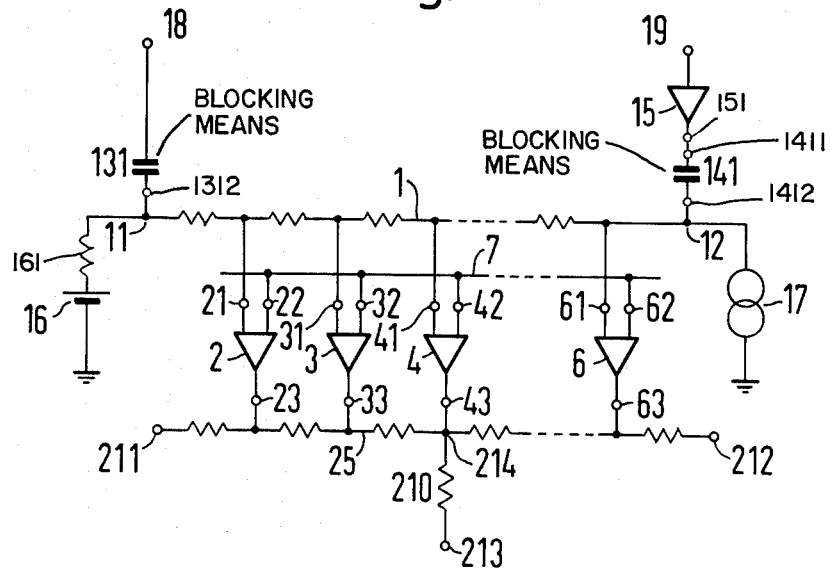
FIG. 4 is a schematic circuit diagram of a phase comparator in which the output signal is emitted as an analog signal.
Figure 5:
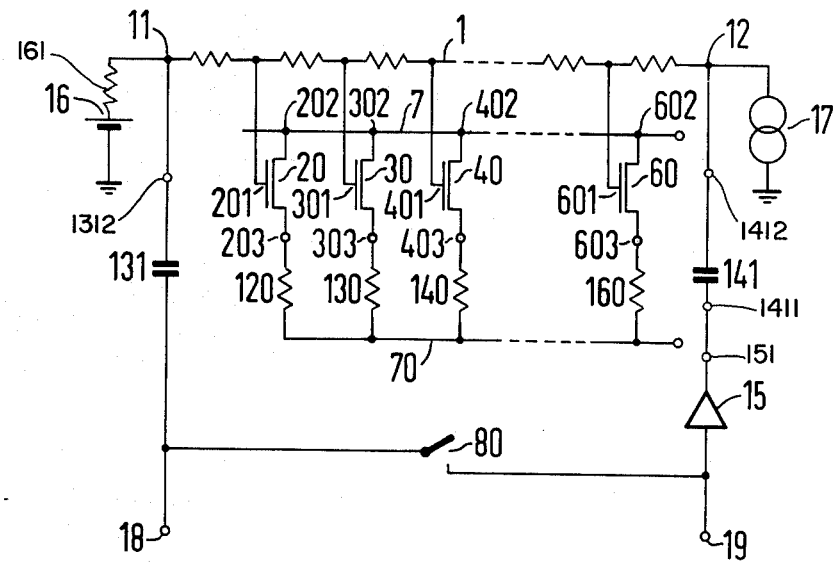
FIG. 5 illustrates an advantageous realization of the comparator and dc voltage eliminator circuits for the circuit arrangement illustrated in FIG. 1.
Figure 6:
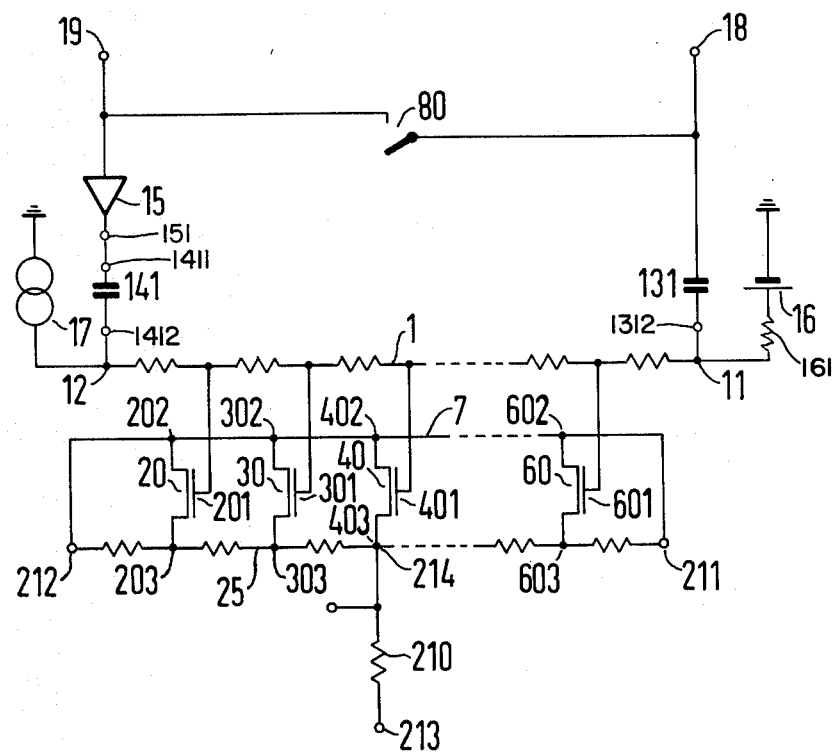
FIG. 6 is a schematic circuit diagram illustrating an advantageous construction for the voltage value comparators and the dc voltage eliminators for a circuit constructed in accordance with FIG. 4.

FIG. 4 represents a circuit arrangement of a phase comparator in which the output signal is emitted as an analog signal. The output of each voltage amplitude comparator is connected to a second resistance line or chain 25. A resistor 210 is connected to a tapping point 214 of the resistance line 25. The circuit arrangement is operated in the same manner as that illustrated in FIG. 1. In addition, however, the two ends 211 and 212 of the second resistance line 25 are connected to a fixed voltage, for example the mean voltage $U_M$, and the free end 213 of the resistor 210 is likewise connected to a fixed voltage, the other end of the resistor 210 being connected to the tapping point 214. The voltage of the tapping point 214 changes in accordance with the number of voltage amplitude comparators which, for example, emit the signal "$> U_M$". By means of a suitable selection of the resistance values between the points at which the comparator outputs are connected to the second resistance line, and by a suitable of the voltage amplitude comparators, it is possible to achieve an arbitrary functional relationship between the output voltage $U_M$ and the phase angle $\phi$. Therefore, the output voltage $U_A$ can be rendered, for example, linearly, quadratically, exponentially, etc dependent upon the phase angle. In FIG. 4 and in the following FIGS. 5 and 6, the dc voltage blocking means are illustrated in the form of capacitors 131 and 141. FIGS. 5 and 6 illustrate advantageous circuit realizations of the circuit arrangements represented in FIGS. 1 and 4, respectively. In FIG. 5, the voltage amplitude comparators are individually realized by the transistors 20, 30, 40 and 60 and by the resistors 120, 130, 140 and 160 as load elements. The respective control electrode terminal 201, 301, 401 and 601 of these transistors is connected to the resistance line 1, whereas a second transistor terminal 202, 302, 402, 602, respectively, is connected to the electrical conductor 7. The load resistors 120–160 are connected to the third terminals 203, 303, 403 and 603, respectively, of the transistors. All of the resistors 120–160 are interconnected by an electrical conductor 70. Preferably, the supply voltage will be selected as the fixed reference voltage. The output signal of the phase comparator is obtained in parallel from the terminals 203, 303, 403 and 603.

The phase comparator illustrated in FIG. 6 differs from that illustrated in FIG. 5 in that the transistor terminals 203, 303, 403 and 603 are directly connected to the second resistance line 25. The load elements required in FIG. 5 are not absolutely necessary in FIG. 6 and can therefore be eliminated. Here again, bipolar or field effect transistors are suitable as the transistors of the voltage value comparators.

The phase comparators illustrated in FIGS. 5 and 6 can very easily be integrated on a semiconductor chip. The resistance lines can be in the form of the line or a line constructed from discrete individual resistors.

In order to be able to adjust the phase shift caused by the inverter 15, prior to a measurement, it is expedient to connect the two signal comparison inputs 18 and 19 by way of a switch, preferably an electronic switch, although such a connection is schematically illustrated in FIGS. 5 and 6 by the switch 80.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:
1. A phase comparator comprising:
    at least two signal comparison inputs for receiving respective signals to be compared;
    a resistance line including a series of resistors;
    an additional resistor connected to one end of said resistance line for receiving a constant voltage;
    at least one voltage amplitude comparator having one input connected to said resistance line, another input connected to a reference voltage, and an output;
    a first dc voltage blocking means connecting said one end of said resistance line to one of said signal comparison inputs;
    an inverter connected to the other signal comparison input;
    a second dc voltage blocking means connecting said inverter to the other end of said resistance line.
2. The phase comparator of claim 1, wherein each of said dc voltage blocking means comprises a capacitor.
3. The phase comparator of claim 1, comprising a plurality of said voltage amplitude comparators each comprising a transistor which includes first, second and third electrodes, said first electrode is a control electrode and is connected to said resistance line as a first voltage comparison input, said second electrode connected to the reference potential as a second voltage comparison input, said third electrode forming said output.
4. The phase comparator of claim 3, wherein each of said voltage amplitude comparators comprises a load element connected between said third electrode and a reference voltage.
5. The phase comparator of claim 4, wherein said load element comprises at least one resistor.
6. The phase comparator of claim 3, wherein each of said transistors is a field effect transistor.
7. The phase comparator of claim 1, comprising a second resistance line including a series of resistors with junctions therebetween and an additional resistor connected between one of said junctions and a reference potential, said outputs of said voltage amplitude comparators connected to respective junctions.
8. The phase comparator of claim 1, comprising a freely-operable switch connected between said signal comparison inputs.
9. The phase comparator of claim 8, wherein said switch comprises an electronic switch.
10. A method of making a phase comparison comprising the steps of:
    applying a constant voltage via a resistor to one end of a tapped resistance line;
    applying a constant current to the other end of the tapped resistance line;
    feeding a first ac signal to be compared to one end of the tapped resistance line;
    feeding an inverted second ac signal to the other end of the tapped resistance line;
    comparing the voltages at each of the taps with a reference voltage which is the arithmetic mean of the voltages at the ends of the tapped resistance line in individual comparators; and
    removing the output in parallel from the individual comparators.
11. The method of claim 10, comprising the steps of:
    applying a fixed voltage to the ends of a second tapped resistance line;
    applying another fixed voltage to one of the taps of the second resistance line;
    applying the parallel output to individual taps of a second tapped resistance line; and
    removing an analog output from the one tap of the second resistance line.
12. The method of claim 11, wherein the step of applying a fixed voltage to the ends of the second tapped resistance line is further defined as applying the reference voltage to the ends of the second tapped resistance line.

* * * * *